United States Patent
Martin et al.

(10) Patent No.: US 9,793,877 B2
(45) Date of Patent: Oct. 17, 2017

(54) ENCAPSULATED BULK ACOUSTIC WAVE (BAW) RESONATOR DEVICE

(71) Applicant: Avago Technologies General IP (Singapore) Pte. Ltd., Singapore (SG)

(72) Inventors: Steve Martin, Fort Collins, CO (US); Osvaldo Buccafusca, Fort Collins, CO (US)

(73) Assignee: AVAGO TECHNOLOGIES GENERAL IP (SINGAPORE) PTE. LTD. (SG)

( * ) Notice: Subject to any disclaimer, the term of this patent is extended or adjusted under 35 U.S.C. 154(b) by 884 days.

(21) Appl. No.: 14/108,668

(22) Filed: Dec. 17, 2013

(65) Prior Publication Data

US 2016/0365843 A1    Dec. 15, 2016

(51) Int. Cl.
| H03H 9/00 | (2006.01) |
| H03H 9/24 | (2006.01) |
| H03H 9/17 | (2006.01) |
| H03H 9/10 | (2006.01) |
| H01L 41/00 | (2013.01) |

(52) U.S. Cl.
CPC ........ *H03H 9/2405* (2013.01); *H03H 9/1007* (2013.01); *H03H 9/17* (2013.01); *H03H 2009/241* (2013.01)

(58) Field of Classification Search
CPC .............................. H03H 3/02; H03H 9/0014
USPC .................... 333/133, 187–189, 191, 193
See application file for complete search history.

(56) References Cited

U.S. PATENT DOCUMENTS

| 5,587,620 A | 12/1996 | Ruby et al. |
| 5,873,153 A | 2/1999 | Ruby et al. |
| 5,910,756 A | 6/1999 | Ella |
| 6,107,721 A | 8/2000 | Lakin |
| 6,181,015 B1 * | 1/2001 | Gotoh ................. H01L 23/3135 257/738 |
| 6,262,637 B1 | 7/2001 | Bradley et al. |
| 6,265,246 B1 | 7/2001 | Ruby et al. |
| 6,376,280 B1 | 4/2002 | Ruby et al. |
| 6,384,697 B1 | 5/2002 | Ruby |
| 6,429,511 B2 | 8/2002 | Ruby et al. |
| 6,507,983 B1 | 1/2003 | Ruby et al. |
| 6,548,943 B2 | 4/2003 | Kaitila et al. |
| 6,550,666 B2 | 4/2003 | Chew et al. |

(Continued)

FOREIGN PATENT DOCUMENTS

| JP | 2007-208845 | 8/2007 |
| JP | 2008-211394 | 9/2008 |

OTHER PUBLICATIONS

Machine Translation of JP2007-208845.

(Continued)

*Primary Examiner* — Dean Takaoka

(57) ABSTRACT

An electronic package includes a die mounted on a first substrate; a second substrate disposed over the first substrate; a pillar wall extending between a surface of the die and an opposing surface of the second substrate to provide separation between the die and the second substrate, the pillar wall extending about a perimeter bounding the die and enclosing a cavity between the first and second substrates; and an encapsulating layer disposed over the first and second substrates and around the pillar wall. Substantially none of the encapsulating layer ingresses into the cavity.

19 Claims, 10 Drawing Sheets

(56) References Cited

U.S. PATENT DOCUMENTS

| | | | |
|---|---|---|---|
| 6,578,754 B1 | 6/2003 | Tung | |
| 6,592,019 B2 | 7/2003 | Tung | |
| 6,681,982 B2 | 1/2004 | Tung | |
| 6,777,263 B1 | 8/2004 | Gan et al. | |
| 6,787,897 B2 | 9/2004 | Geefay et al. | |
| 6,828,713 B2 | 12/2004 | Bradley et al. | |
| 6,979,597 B2 | 12/2005 | Geefay et al. | |
| 7,246,421 B2* | 7/2007 | Namba | H01L 21/568 29/25.35 |
| 7,248,133 B2* | 7/2007 | Koga | H01L 24/97 264/272.11 |
| 7,275,292 B2 | 10/2007 | Ruby et al. | |
| 7,280,007 B2 | 10/2007 | Feng et al. | |
| 7,289,008 B2* | 10/2007 | Kuroki | H04B 1/0057 333/133 |
| 7,345,410 B2 | 3/2008 | Grannen et al. | |
| 7,388,454 B2 | 6/2008 | Ruby et al. | |
| 7,408,428 B2 | 8/2008 | Larson, III | |
| 7,616,079 B2 | 11/2009 | Tikka et al. | |
| 7,629,865 B2 | 12/2009 | Ruby | |
| 7,659,796 B2* | 2/2010 | Funami | H03H 9/6483 333/133 |
| 7,863,699 B2* | 1/2011 | Dropmann | H01L 23/66 257/254 |
| 7,889,024 B2 | 2/2011 | Bradley et al. | |
| 8,008,837 B2* | 8/2011 | Fukano | H03H 9/059 29/25.35 |
| 8,102,044 B2 | 1/2012 | Ruby et al. | |
| 8,248,185 B2 | 8/2012 | Choy et al. | |
| 8,314,472 B2 | 11/2012 | Parkhurst et al. | |
| 8,344,504 B2 | 1/2013 | Wholey et al. | |
| 8,587,389 B2* | 11/2013 | Koga | H03H 9/0576 333/133 |
| 8,680,944 B2* | 3/2014 | Ye | H03H 9/0571 333/133 |
| 2007/0205850 A1 | 9/2007 | Jamneala et al. | |
| 2008/0258842 A1 | 10/2008 | Ruby et al. | |
| 2009/0102319 A1 | 4/2009 | Nakatsuka et al. | |
| 2010/0327994 A1 | 12/2010 | Choy et al. | |
| 2011/0180391 A1 | 7/2011 | Larson, III et al. | |
| 2011/0193650 A1* | 8/2011 | Takenoshita | H03H 9/0576 333/4 |
| 2012/0177816 A1 | 7/2012 | Larson, III et al. | |
| 2012/0182091 A1* | 7/2012 | Ookubo | H03H 3/08 333/193 |
| 2012/0218056 A1 | 8/2012 | Burak | |
| 2012/0248941 A1 | 10/2012 | Shirakawa et al. | |
| 2012/0280767 A1 | 11/2012 | Burak et al. | |
| 2012/0293278 A1 | 11/2012 | Burak et al. | |
| 2013/0126992 A1 | 5/2013 | Ehrenpfordt et al. | |
| 2013/0250527 A1* | 9/2013 | Hatanaka | H01L 23/295 361/748 |
| 2013/0314177 A1 | 11/2013 | Burak et al. | |

OTHER PUBLICATIONS

Machine Translation of JP2008-211394.

"IEEE Xplore Abstract for Suppression of Acoustic Energy Leakage in FBARS with Al Bottom Electrode: FEM Simulation and Experimental Results", pp. 28-31, Oct. 2007.

Ohara, et al., "Suppression of Acoustic Energy Leakage in FBARs with Al Bottom Electrode: FEM Simulation and Experimental Results", 2007 IEEE Ultrasonics Symposium, pp. 1657-1660, Oct. 28-31, 2007.

Co-pending U.S. Appl. No. 13/662,460, filed Oct. 27, 2012.
Co-pending U.S. Appl. No. 13/658,024, filed Oct. 23, 2012.
Co-pending U.S. Appl. No. 13/663,449, filed Oct. 29, 2012.
Co-pending U.S. Appl. No. 13/660,941, filed Oct. 25, 2012.
Co-pending U.S. Appl. No. 13/654,718, filed Oct. 18, 2012.

Katsumata, et al. "Packaging Innovations: Graphene for Next Generation Electronics Packaging", Chip Scale Review, vol. 17, No. 5, Sep.-Oct. 2013.

Santagata, et al. "Mechanical Design and Characterization for MEMS Thin-Film Packaging", Journal of Microelectromechanical Systems, vol. 21, No. 1, Feb. 2012.

"IMAPS 9th International Conference and Exhibition on Device Packaging", Mar. 11-14, 2013, Radisson Fort McDowell Resort and Casino, Scottsdale/Fountain Hills, Arizona.

* cited by examiner

ENCAPSULATED BULK ACOUSTIC WAVE (BAW) RESONATOR DEVICE

BACKGROUND

In many electronic applications, electrical resonators are used. For example, in many wireless communications devices, radio frequency (rf) and microwave frequency resonators are used as filters to improve reception and transmission of signals. Filters typically include inductors and capacitors, and more recently resonators.

As will be appreciated, it is desirable to reduce the size of components of electronic devices. Many known filter technologies present a barrier to overall system miniaturization. With the need to reduce component size, a class of resonators based on the piezoelectric effect has emerged. In piezoelectric-based resonators, acoustic resonant modes are generated in the piezoelectric material. These acoustic waves are converted into electrical waves for use in electrical applications.

One type of piezoelectric resonator is a bulk acoustic wave (BAW) resonator. Typically, there are two types of BAW resonators: a Film Bulk Acoustic Resonator (FBAR) and a solidly mounted bulk acoustic resonator (SMR). Both the FBAR and the SMR comprise acoustic stacks that are disposed over a reflective element. The reflective element of an FBAR is a cavity, normally in a substrate over which the acoustic stack is mounted. The reflective element of an SMR is a Bragg reflector comprising alternating layers of high acoustic impedance and low acoustic impedance layers.

The BAW resonator has the advantage of small size and lends itself to Integrated Circuit (IC) manufacturing tools and techniques. The FBAR includes an acoustic stack comprising, inter alia, a layer of piezoelectric material disposed between two electrodes. Acoustic waves achieve resonance across the acoustic stack, with the resonant frequency of the waves being determined by the materials in the acoustic stack.

Generally, a bulk acoustic wave (BAW) resonator has a layer of piezoelectric material between two conductive plates (electrodes), which may be formed on a thin membrane. The piezoelectric material may be a thin film of various materials, such as aluminum nitride (AlN), zinc oxide (ZnO), or lead zirconate titanate (PZT), for example. Thin films made of AlN are advantageous since they generally maintain piezoelectric properties at high temperature (e.g., above 400° C.). However, AlN has a lower piezoelectric coefficient $d_{33}$ than both ZnO and PZT, for example.

In FBAR (film bulk acoustic resonators) devices, strain sensors, mechanical oscillators, and other electronic and microelectromechanical systems (MEMS) devices, it can be necessary to keep the device isolated mechanically and chemically from its surrounding environment. For example, the performance of an FBAR device is severely degraded if the motional device is in contact with the overmold compound of a typical microelectronics package. To this end, many devices have complicated and expensive encapsulation processes and methodologies.

What is needed, therefore, is a structure that overcomes at least the shortcomings of known structures described above.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DEFINED TERMINOLOGY

Figure 1:
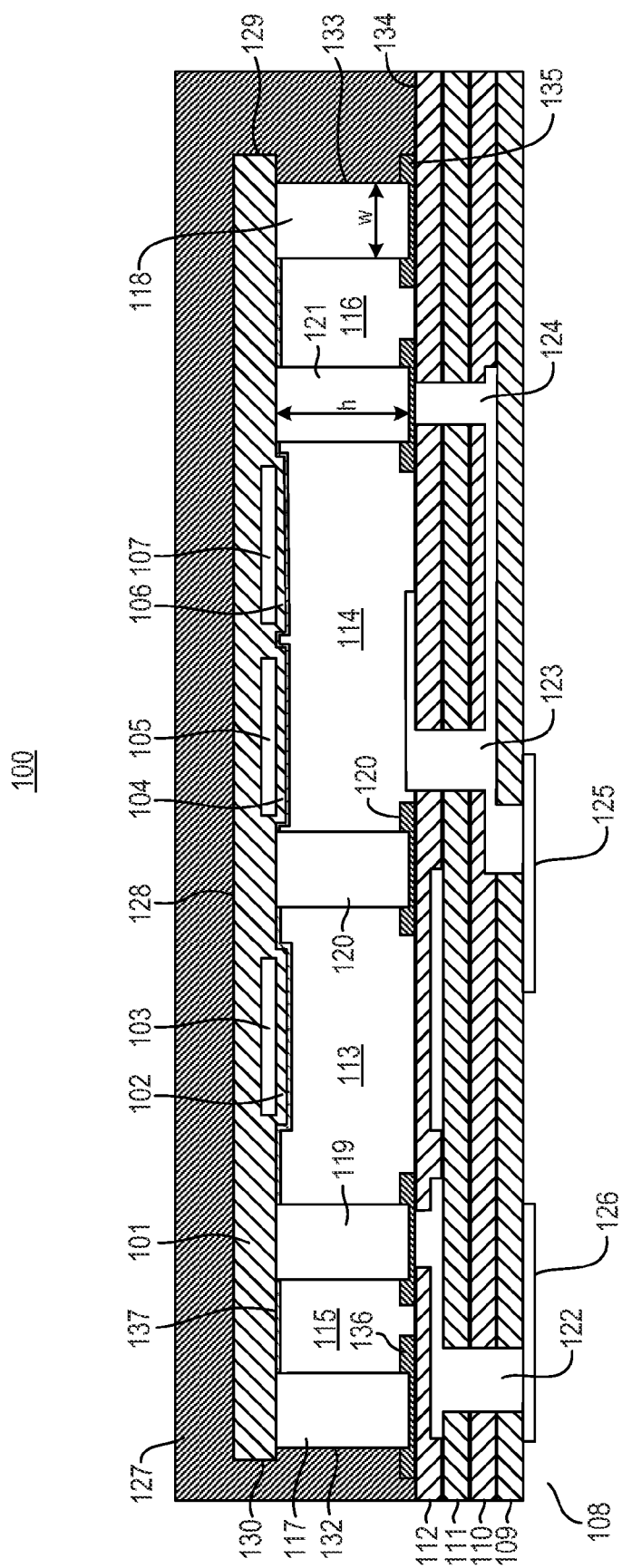
FIG. 1 is a cross-sectional view of an encapsulated electronic structure 100 in accordance with a representative embodiment.

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

DETAILED DESCRIPTION

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the illustrative embodiments. Such methods and apparati are clearly within the scope of the present teachings.

Generally, it is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

The present teachings relate generally to packaged electronic devices and circuits. More specifically, the electronic devices and circuits comprise bulk acoustic wave (BAW) resonators including film bulk acoustic wave resonators (FBARs) and surface mount resonators (SMRs) in various applications. Moreover, BAW resonators of the present teachings may also comprise stacked bulk acoustic resonator (SBAR) device, a double bulk acoustic resonator (DBAR) device, or a coupled resonator filter (CRF) device.

Contemplated applications of the BAW resonators of the present teachings include, but are not limited to communication filter applications and MEMs applications. For example, the bulk acoustic wave (BAW) resonators of the present teachings may be arranged in a ladder-filter arrangement, such as described in U.S. Pat. No. 5,910,756 to Ella, and U.S. Pat. No. 6,262,637 to Bradley, et al., the disclosures of which are specifically incorporated herein by reference. The electrical filters may be used in a number of applications, such as in duplexers.

Certain details of BAW resonators, including materials and methods of fabrication, may be found in one or more of the following commonly owned U.S. Patents and Patent Applications: U.S. Pat. No. 6,828,713 to Bradley, et al.; U.S. Pat. No. 6,107,721, to Lakin; U.S. Pat. Nos. 5,587,620, 5,873,153, 6,384,697, 6,507,983, 7,275, 292, 7,388,454 and 7,629,865 to Ruby, et al.; U.S. Pat. No. 7,280,007 to Feng, et al.; U.S. Patent Application Publication No. 2007/0205850 to Jamneala, et al.; U.S. Pat. No. 8,248,185 to Choy, et al.; U.S. Patent Application Publication No. 2010/0327994 to Choy, et al.; U.S. patent application Ser. No. 13/662,460 entitled BULK ACOUSTIC WAVE RESONATOR HAVING PIEZOELECTRIC LAYER WITH MULTIPLE DOPANTS to John Choy, et al. and filed on Oct. 27, 2012; U.S. Patent Application Publications 20110180391 and 20120177816 to Larson, et al. The respective disclosures of the above patents, patent application publications and patent applications are specifically incorporated herein by reference. It is emphasized that the components, materials and method of fabrication described in these patents and patent applications are representative and other methods of fabrication and materials within the purview of one of ordinary skill in the art are contemplated.

Examples of stacked bulk acoustic resonators, as well as their materials and methods of fabrication, may be found in U.S. Pat. No. 7,889,024 to Paul Bradley et al., U.S. Patent Application Publication No. 2012/0248941 to Shirakawa et al., and U.S. Patent Application Publications Nos. 2012/0218056, 2012/0280767, and 2012/0293278 to Burak et al.; U.S. patent application Ser. No. 13/658,024 to Nikkel et al.; U.S. patent application Ser. No. 13/663,449 to Burak et al.; U.S. patent application Ser. No. 13/660,941 to Burak et al.; U.S. patent application Ser. No. 13/654,718 to Burak et al.; U.S. Patent App. Pub. No. 2008/0258842 to Ruby et al.; and U.S. Pat. No. 6,548,943 to Kaitila et al. Certain details of temperature compensation in the context of acoustic resonators are described in U.S. Pat. No. 7,345,410 to Grannen et al. and U.S. Pat. No. 7,408,428 filed Oct. 29, 2004 to Larson et al. The respective disclosures of the above patents and patent applications are specifically incorporated herein by reference. It is emphasized that the components, materials and method of fabrication described in these patents and patent applications are representative and other methods of fabrication and materials within the purview of one of ordinary skill in the art are contemplated.

FIG. 1 is a cross-sectional view of an encapsulated electronic structure 100 in accordance with a representative embodiment. The encapsulated electronic structure 100 comprises a device substrate 101. The device substrate 101 comprises a first BAW resonator 102 disposed over a first cavity 103 formed in the device substrate 101, a second BAW resonator 104 disposed over a second cavity 105 formed in the device substrate 101, and a third BAW resonator 106 disposed over a third cavity 107 formed in the device substrate 101. As appreciated by one of ordinary skill in the art, the first, second and third BAW resonators 102, 104, 106 are FBARs. It is emphasized that first, second and third BAW resonators 102, 104, 106 may be SMRs with the first, second and third cavities 103, 105, 107 being replaced by an acoustic reflector (not shown) such as a Bragg reflector comprising alternating layers (not shown) of high and low acoustic impedance materials.

A printed circuit board (PCB) 108 is disposed opposing the device substrate 101. The PCB 108 may be, for example, a product module substrate, that is packaged in accordance with representative embodiments described herein. In a representative embodiment, the PCB 108 comprises a plurality of layers 109, 110, 111 and 112. The PCB 108 and constituent layers 109, 110, 111 and 112 may be of a known material selected for the application of the circuits supporting the application of the first, second and third BAW resonators 102, 104, 106. Illustratively, the constituent layers 109, 110, 111 and 112 may be FR4, epoxy glass or Teflon® PCB.

Between the device substrate 101 and the PCB 108, a first region 113, a second region 114, a third region 115 and a fourth region 116 are formed by the separation provided by a first pillar 117, a second pillar 118, a third pillar 119, a fourth pillar 120 and a fifth pillar 121 as depicted in FIG. 1. Notably, upon encapsulation by a molding compound, the first through fourth regions 113~116 form a cavity between opposing inner surfaces of the device substrate 101 and the PCB 108. The first and second pillars 117, 118 provide structural support in the creation of space between the device substrate 101 and the PCB 108. As appreciated by one of ordinary skill in the art, the first and second regions 113, 114 provide the "topside" cavities to the first, second and third BAW resonators 102,104, 106 required for their proper mechanical oscillation. Generally, as described below, a pillar wall is disposed circumferentially around the first, second and third BAW resonators 102, 104, 106 and their attendant circuitry. As can be appreciated, first and second pillars 117, 118 are two sides or walls of the circumferentially disposed pillar wall. The third, fourth and fifth pillars 119~121 provide electrical connections between the first, second and third BAW resonators 102, 104, 106 and first, second and third electrical connections 122~124 provided in the PCB 108. As depicted for purposes of illustration, the first, second and third electrical connections 122~124 are in electrical contact with first and second bond pads 125, 126 which are used for electrically connecting the first, second and third BAW resonators 102, 104, 106 to circuitry (not shown) upon mounting of the encapsulated electronic structure 100 to another substrate (not shown).

An encapsulating layer 127 is provided over a side 128 of the device substrate 101 opposing the side of the device substrate 101 over which the first, second and third BAW resonators 102,104,106 are disposed. The encapsulating layer also extends along first and second sides 129,130 of the device substrate 101, along side 132 of first pillar 117, and along side 133 of second pillar 118. Finally, the encapsulating layer 127 is provided over a top surface 134 of layer 112 of PCB 108.

The encapsulating layer 127 may be one of a number of known electronic molding compounds, and, as its name suggests, encapsulates the device substrate 101 with the PCB 108. Illustratively, the encapsulating layer comprises a commercially available glass-filled epoxy, and has a thickness in the range of approximately 0.5 mm to approximately 4.0 mm. Notably, in the depicted embodiment the first and second pillars 117, 118 extend between the device substrate 101 and the PCB 108, and prevent the ingress of the encapsulating layer 127 into any of the first through fourth regions 113~116, and thus the cavity formed therefrom. As such, the molding compound from which it is formed is prevented from contacting the first, second and third BAW resonators 102,104,106 or any of their attendant circuitry. As appreciated by one of ordinary skill in the art, the contacting of the molding compound can be detrimental to the performance of the BAW resonator circuit of which first, second and third BAW resonators 102,104,106 are a part.

In certain embodiments, the encapsulating layer 127 may provide a hermetic seal of the first, second and third BAW resonators 102,104,106 or any of their attendant circuitry. However, this is not essential to ensure hermeticity. For example, the first and second pillars 117, 118 may form a hermetic seal through bonding to first solder pads 135 disposed over top surface 134 of the PCB 108. Similarly, third and fourth pillars 119, 120 are bonded over top surface 134 of layer 112 of PCB 108 through second solder pads 136, and are configured to make electrical contact to electrical connections (e.g., electrical connection 122) of the PCB 108. Illustratively, the first and second solder pads 135,136 comprise Sn, SnAg, or a SnAgCu alloy deposited using a known method. In certain representative embodiments, a sealing layer 137 is provided over the first, second and third BAW resonators 102,104,106 and attendant circuitry, and provides a hermetic seal thereof. Illustratively, the sealing layer may be silicon nitride ($Si_3N_4$), silicon carbide (SiC), silicon oxynitride ($SiO_xN_y$), diamond-like carbon (DLC), or other suitable material within the purview of one of ordinary skill in the art. The sealing layer has a thickness between approximately 500 Å to approximately 4000 Å.

The first through fifth pillars 117~121 may be as described in U.S. Pat. Nos. 6,681,982, 6,592,019, 6,578,754 and 6,550,666; and commonly owned U.S. Pat. Nos. 8,314,472 and 8,344,504. The disclosures of these patents are specifically incorporated herein by reference. Generally, the first through fifth pillars 117~121 are patterned using a thick spin-on resist or a thick dry film resist. The first through fifth pillars 117~121 are then constructed by plating an appropriately conductive material. Illustratively, the first through fifth pillars 117~121 are copper, but other materials are contemplated. Generally, the first through fifth pillars 117~121 are metal or a metal alloy. The first through fifth pillars 117~121 have a height "h" of approximately 10.0 μm to approximately 70.0 μm and a width "w" of approximately 10.0 μmm to 200.0 μm.

Figure 2A:
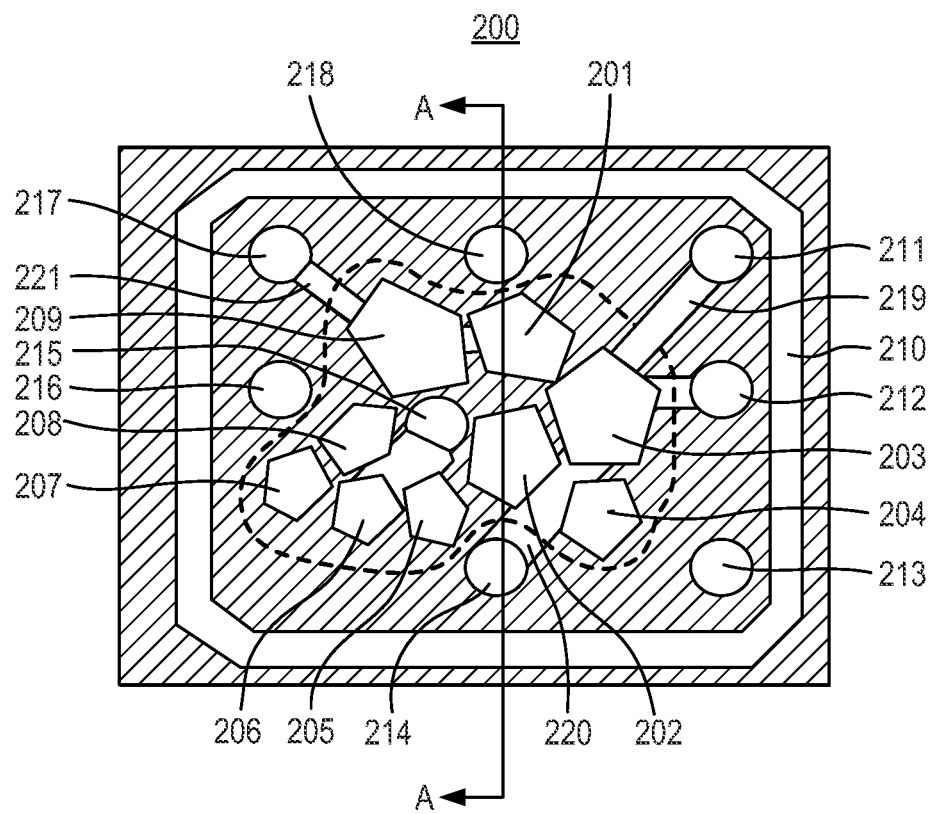
FIG. 2A is a top view of a device substrate in accordance with a representative embodiment.

FIG. 2A is a top view of a device substrate 200 in accordance with a representative embodiment. Many aspects of the device substrate 200 are common to those of the device substrate 101 and are not necessarily repeated in order to avoid obscuring the description of the currently described representative embodiment.

First through ninth BAW resonators 201~209 are provided over the device substrate 200. First pillar 210 is provided circumferentially around the first through ninth BAW resonators 201~209 and their attendant circuitry (depicted by the dotted line in FIGS. 2A~2B and often referred to as the "BAW resonator active area") forming a pillar wall to provide a barrier to the encapsulating layer (not shown in FIG. 2A) disposed over the device substrate 200. Second through ninth pillars 211~218 are provided over the device substrate 200 and provide electrical connections from the first through ninth BAW resonators 201~209 to circuitry external to the device substrate (e.g., to circuitry on an opposing PCB such as PCB 108). Additionally, electrical traces can be provided over the device substrate 200 to enable selective electrical connections between components of the device substrate 200 to provide a desired electrical circuit (e.g., a ladder filter). For example, a first circuit trace 219 provides an electrical connection between the third BAW resonator 203 and the second pillar 211. Similarly, second circuit trace 220 provides an electrical connection between the second BAW resonator 202, the third BAW resonator 203, the fourth BAW resonator 204 and the fourth pillar 213. Finally, in the depicted embodiment, third circuit trace 221 is provided between seventh pillar 217 and ninth BAW resonator 209.

In accordance with representative embodiments, the first pillar 210 is formed over the device substrate 200 during standard processing using a method known to those practicing the art. Generally, the first pillar 210 comprises the same material (e.g., copper) and is fabricated at the same time as the second through ninth pillars 211~218, which generally provide electrical interconnectivity. Moreover, the second through ninth pillars 211~218 are fabricated at the same time as the first pillar 210. Notably, however, the second through ninth pillars 211~218 are not necessarily formed of the same material as the first pillar 210 or as each other, and do not need to be formed at the same time. Furthermore, in a representative embodiment, the first through ninth pillars 206~214 are formed near the end of the processing steps for creating the first through ninth BAW resonators 201~209 over the device substrate 200.

Figure 2B:
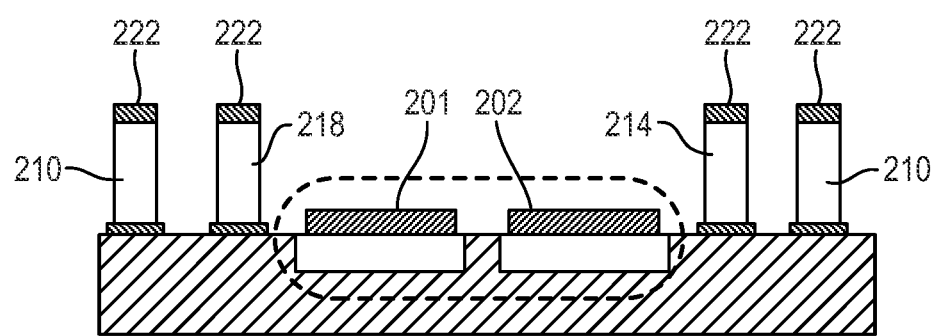
FIG. 2B is a cross-sectional view of a device substrate taken along the line A-A' in FIG. 2A.

FIG. 2B is a cross-sectional view of device substrate 200 taken along the line A-A' in FIG. 2A. Notably, after formation of the first through ninth pillars 210~218, a solder 222 is provided (e.g., plated) over each of the first through ninth pillars 210~218. This solder can be Sn, SnAg, a SnAgCu alloy, or other suitable eutectic material, and illustratively has a thickness of approximately 10 μm to approximately 40 μm. After completion of BAW resonator die processing, the substrate (wafer) is singulated into individual die (i.e., device substrate 200) using a method known to one of ordinary skill in the art. The device substrate 200 can then be attached to the PCB (not shown in FIG. 2B).

Figure 3:
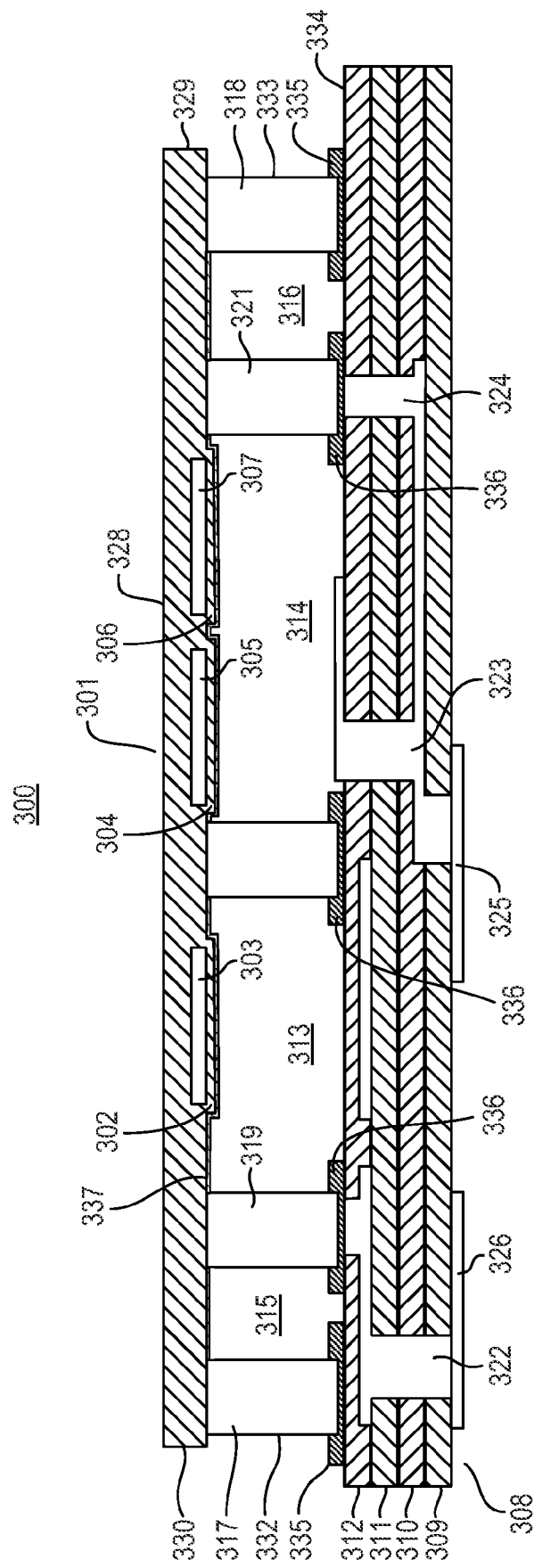
FIG. 3 is a cross-sectional view of an electronic structure in accordance with a representative embodiment.

FIG. 3 is a cross-sectional view of an electronic structure 300 in accordance with a representative embodiment. Many aspects of the electronic structure 300 are common to those of the encapsulated electronic structure 100, and the device substrate 200 described above, and are not necessarily repeated in order to avoid obscuring the description of the currently described representative embodiment. In essence, the embodiments of FIG. 3 depict the electronic structure after bonding of a device substrate 301 to a PCB 308, but prior to application of a suitable molding compound to encapsulate the electronic structure.

The device substrate 301 comprises a first BAW resonator 302 disposed over a first cavity 303 formed in the device substrate 301, a second BAW resonator 304 disposed over a second cavity 305 formed in the device substrate 301, and a third BAW resonator 306 disposed over a third cavity 307 formed in the device substrate 301. As appreciated by one of ordinary skill in the art, the first, second and third BAW resonators 302, 304, 306 are FBARs. It is emphasized that first, second and third BAW resonators 302, 304, 306 may be SMRs with the first, second and third cavities 303, 305, 307 being replaced by an acoustic reflector (not shown) such as a Bragg reflector comprising alternating layers (not shown) of high and low acoustic impedance materials.

The printed circuit board (PCB) 308 is disposed opposing the device substrate 301. The PCB 308 may be, for example, a product module substrate, that is packaged in accordance with representative embodiments described herein. In a representative embodiment, the PCB 308 comprises a plurality of layers 309, 310, 311 and 312. The PCB 308 and constituent layers 309, 310, 311 and 312 may be of a known material such as described above, and selected for the application of the circuits supporting the application of the first, second and third BAW resonators 302, 304, 306.

Between the device substrate 301 and the PCB 308, a first region 313, a second region 314, a third region 315 and a fourth region 316 are formed by the separation provided by a first pillar 317, a second pillar 318, a third pillar 319, a fourth pillar 320 and a fifth pillar 321 as depicted in FIG. 1. Notably, upon encapsulation by a molding compound, the first through fourth regions 313~316 form a cavity between opposing inner surfaces of the device substrate 301 and the PCB 308. Moreover, the first and second pillars 317, 318 provide structural support in the creation of space between the device substrate 101 and the PCB 108. As appreciated by one of ordinary skill in the art, the first and second regions 313, 314 provide the "topside" cavities to the first, second and third BAW resonators 102,104, 106 required for their proper mechanical oscillation. Generally, as noted above, a pillar wall is disposed circumferentially around the first, second and third BAW resonators 102, 104, 106 and their attendant circuitry. As can be appreciated, first and second pillars 317, 318 are two sides or walls of the circumferentially disposed pillar wall (e.g., two walls of first pillar 210 of the embodiment of FIG. 2A). The third, fourth and fifth pillars 319~321 provide electrical connections between the first, second and third BAW resonators 102,104,106 and first, second and third electrical connections 322~324 provided in the PCB 108. As depicted for purposed of illustration, the first, second and third electrical connections 322~324 are in electrical contact with first, and second bond pads 325, 326 which are used for electrically connecting the first, second and third BAW resonators 102, 104, 106 to circuitry (not shown) upon mounting of the encapsulated electronic structure 100 to another substrate (not shown).

During fabrication, the device substrate 301 is attached to the PCB 308. Notably, the device substrate 301 is flipped upside-down. First through fifth pillars 317~321 are placed in contact with the PCB 308 and selectively in electrical contact with first, second and third electrical connections 322~324 on the PCB 308 and subjected to high temperature (e.g., approximately 240° C.) to reflow the solder and make electrical and mechanical connections between the PCB 308 and the first through fifth pillars 317~321, resulting in the electronic structure 300. As noted above, in a representative embodiment, the first and second pillars illustratively comprise copper with a layer of solder (e.g., first and second solder pads 335, 336) disposed thereover thereby creating a hermetic eutectic bond with the PCB 308.

After bonding of the device substrate 301 to the PCB 308 is completed, a molding compound (not shown in FIG. 3) is provided over top surface 328 of the device substrate 301, along side 332 of first pillar 317, and along side 333 of second pillar 318 and over a top surface 334 of layer 312 of PCB 308. In another representative embodiment, the molding compound (not shown in FIG. 3) is disposed along side 332 of first pillar 317, and along side 333 of second pillar 318 and over a top surface 334 of layer 312 of PCB 308, but not over top surface 328, which remains uncovered.

Figure 4A:
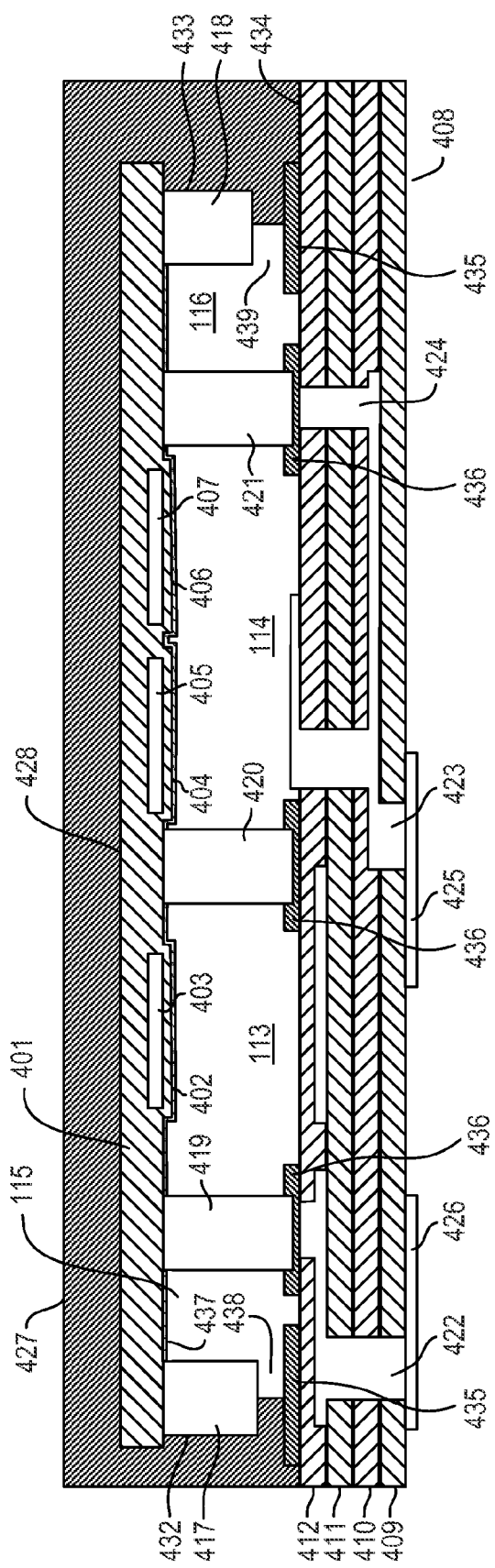
FIG. 4A is a cross-sectional view of an encapsulated electronic structure in accordance with a representative embodiment.

FIG. 4A is a cross-sectional view of an encapsulated electronic structure 400 in accordance with a representative embodiment. Many aspects of the encapsulated electronic structure 400 are common to those of the encapsulated electronic structure 100, the device substrate 200 and the electronic structure 300 described above, and are not necessarily repeated in order to avoid obscuring the description of the currently described representative embodiment.

As noted above, the pillars of representative embodiments illustratively comprise copper with a layer of solder disposed thereover thereby creating a hermetic eutectic bond with the PCB. Alternatively, the pillar wall that is disposed circumferentially around the BAW resonators and attendant circuitry may not contact the PCB, but rather is disposed close enough to avoid mold compound to ingress close to the BAW resonators and attendant circuitry. The encapsulated electronic structure 400 is fabricated in this manner.

The encapsulated electronic structure 400 comprises a device substrate 401. The device substrate 401 comprises a first BAW resonator 402 disposed over a first cavity 403 formed in the device substrate 401, a second BAW resonator 404 disposed over a second cavity 405 formed in the device substrate 401, and a third BAW resonator 406 disposed over a third cavity 407 formed in the device substrate 401. As appreciated by one of ordinary skill in the art, the first, second and third BAW resonators 402, 404, 406 are FBARs. It is emphasized that first, second and third BAW resonators 402, 404, 406 may be SMRs with the first, second and third cavities 403, 405, 407 being replaced by an acoustic reflector (not shown) such as a Bragg reflector comprising alternating layers (not shown) of high and low acoustic impedance materials.

A printed circuit board (PCB) 408 is disposed opposing the device substrate 401. The PCB 408 may be, for example, a product module substrate, that is packaged in accordance with representative embodiments described herein. In a representative embodiment, the PCB 408 comprises a plurality of layers 409, 410, 411 and 412. The PCB 408 and constituent layers 409, 410, 411 and 412 may be of a known material (e.g., FR4) selected for the application of the circuits supporting the application of the first, second and third BAW resonators 402, 404, 406.

Between the device substrate 401 and the PCB 408, a first region 413, a second region 414, a third region 415 and a fourth region 416 are formed by the separation provided by a first pillar 417, a second pillar 418, a third pillar 419, a fourth pillar 420 and a fifth pillar 421 as depicted in FIG. 4A.

Notably, upon encapsulation by a molding compound, the first through fourth regions 413~416 form a cavity between opposing inner surfaces of the device substrate 401 and the PCB 408. Moreover, the first and second pillars 417, 418 provide structural support in the creation of space between the device substrate 401 and the PCB 408. As appreciated by one of ordinary skill in the art, the first and second regions 413, 414 provide the "topside" cavities to the first, second and third BAW resonators 402, 404, 406 required for their proper mechanical oscillation. Generally, as described above, a pillar wall is disposed circumferentially around the first, second and third BAW resonators 402, 404, 406 and their attendant circuitry (depicted by the dotted line in FIGS. 4A~4B and, as noted above, often referred to as the "BAW resonator active area"). As can be appreciated, first and second pillars 417, 418 are two sides or walls of the circumferentially disposed pillar wall. The third, fourth and fifth pillars 419~421 provide electrical connections between the first, second and third BAW resonators 402, 404, 406 and first, second and third electrical connections 422~424 provided in the PCB 408. As depicted for purposes of illustration, the first, second and third electrical connections 422~424 are in electrical contact with first and second bond pads 425, 426 which are used for electrically connecting the first, second and third BAW resonators 402, 404, 406 to circuitry (not shown) upon mounting of the encapsulated electronic structure 400 to another substrate (not shown).

An encapsulating layer 427 is provided over a side 428 of the device substrate 401 opposing the side of the device substrate 401 over which the first, second and third BAW resonators 402, 404, 406 are disposed. The encapsulating layer also extends along first and second sides 430, 431 of the device substrate 401, along side 432 of first pillar 417, and along side 133 of second pillar 418. Finally, the encapsulating layer 427 is provided over a top surface 434 of layer 412 of PCB 408.

The encapsulating layer 427 may be one of a number of known electronic molding compounds, and, as its name suggests, encapsulates the device substrate 401 with the PCB 408. Notably, in the depicted embodiment the first and second pillars 417, 418 do not contact the PCB 408, but rather a first gap 438 and a second gap 439 exist between the first and second pillars 417, 418, respectively, and the PCB 408. The first and second gaps 438, 439 are comparatively small having a height of approximately 250 nm to approximately 2000 nm so that encapsulating layer 427 cannot ingress into any of the first through fourth regions 413~416. As depicted in FIG. 4A, the encapsulating layer does not extend across the width of the first gap 438 or the second gap 439. As such, the molding compound is prevented from contacting the first, second and third BAW resonators 402, 404, 406 or any of their attendant circuitry. As appreciated by one of ordinary skill in the art, the contacting of the molding compound can be detrimental to the performance of the BAW resonator circuit of which first, second and third BAW resonators 402, 404, 406 are a part.

Figure 4B:
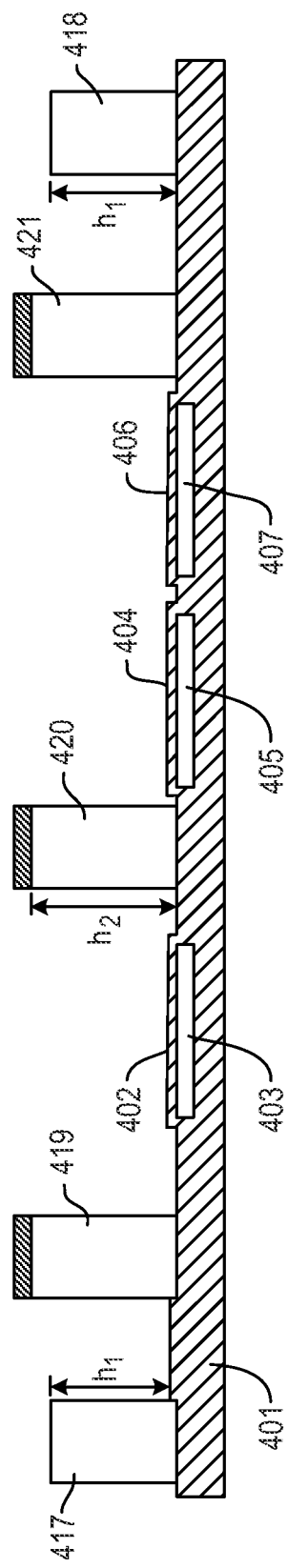
FIG. 4B is a cross-sectional view of device substrate in accordance with a representative embodiment.

FIG. 4B is a cross-sectional view of device substrate 401 comprising first through fifth pillars 417~421 prior to bonding to the PCB 408. In the representative embodiment, first and second pillars 418, 419, which form two sides of a pillar wall extending circumferentially around the first, second and third BAW resonators 402, 404, 406 and their attendant circuitry. In the representative embodiment, the first and second pillars 418, 419 (and all other pillars that form the pillar wall) are made of a different material than the third through fifth pillars 419~421. Alternatively, the first and second pillars 418, 419 (and all other pillars that form the pillar wall) are made of the same material as the third through fifth pillars 419~421. Notably, whereas the third through fifth pillars 419~421 form electrical interconnections between the first, second and third BAW resonators 402, 404, 406 and their attendant circuitry, and first, second and third electrical connections 422~424 of the PCB 408, the first and second pillars 417, 418 may be formed from a photo-definable polymer that has been permanently cured to the device substrate 401. Moreover, the first and second pillars 417, 418 have a height $h_1$ that is smaller than a height $h_2$ of the third through fifth pillars 419~421. As the height $h_2$ is less than the height $h_1$, first and second gaps 438, 439 depicted in FIG. 4A exist between the respective ends of the first and second pillars 418, 419 and the upper surface 434 of the PCB 108. The first and second pillars 417, 418 may form a hermetic seal through bonding to first solder pads 535 disposed over surface 534 of the PCB 408, and electrical contact (e.g., to second bond pad 425) can be made via second solder pads 436. As noted above after attachment of the device substrate 401 to the PCB 408, a typical overmold process using a microelectronic molding compound known to one of ordinary skill in the art is carried out and results in the encapsulated electronic structure 400 depicted in FIG. 4A.

Figure 5:
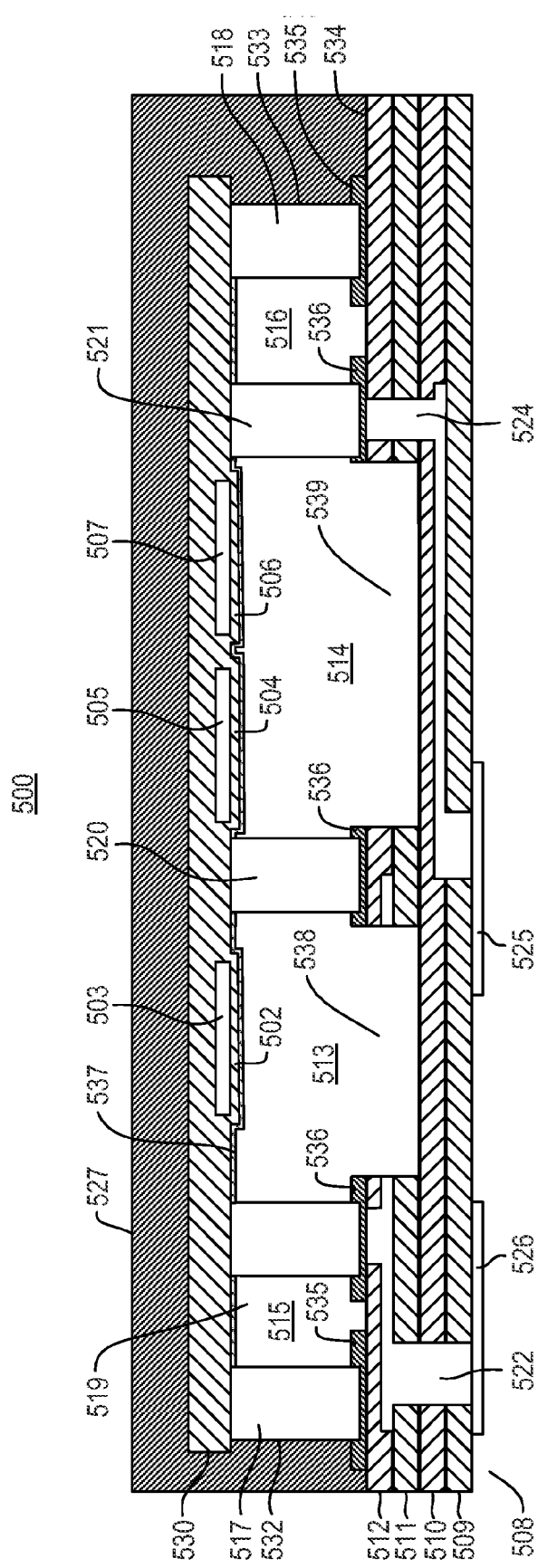
FIG. 5 is a cross-sectional view of an encapsulated electronic structure in accordance with a representative embodiment.

FIG. 5 is a cross-sectional view of an encapsulated electronic structure 500 in accordance with a representative embodiment. Many aspects of the encapsulated electronic structure 500 are common to those of the encapsulated electronic structure 100, the device substrate 200, the electronic structure 300, and the encapsulated electronic structure 400 described above, and are not necessarily repeated in order to avoid obscuring the description of the currently described representative embodiment.

The encapsulated electronic structure 500 comprises a device substrate 501. The device substrate 501 comprises a first BAW resonator 502 disposed over a first region 503 formed in the device substrate 501, a second BAW resonator 504 disposed over a second region 505 formed in the device substrate 501, and a third BAW resonator 506 disposed over a third region 507 formed in the device substrate 501. As appreciated by one of ordinary skill in the art, the first, second and third BAW resonators 502, 504, 506 are FBARs. It is emphasized that first, second and third BAW resonators 502, 504, 506 may be SMRs with the first, second and third regions 503, 505, 507 being replaced by an acoustic reflector (not shown) such as a Bragg reflector comprising alternating layers (not shown) of high and low acoustic impedance materials.

A printed circuit board (PCB) 508 is disposed opposing the device substrate 501. The PCB 508 may be, for example, a product module substrate, that is packaged in accordance with representative embodiments described herein. In a representative embodiment, the PCB 508 comprises a plurality of layers 509, 510, 511 and 512. The PCB 508 and constituent layers 509, 510, 511 and 512 may be of a known material (e.g., FR4) selected for the application of the circuits supporting the application of the first, second and third BAW resonators 502, 504, 506.

Between the device substrate 501 and the PCB 508, a first region 513, a second region 514, a third region 515 and a fourth region 516 are formed by the separation provided by a first pillar 517, a second pillar 518, a third pillar 519, a fourth pillar 520 and a fifth pillar 521 as depicted in FIG. 1. Notably, upon encapsulation by a molding compound, the first through fourth regions 513~516 form a cavity between opposing inner surfaces of the device substrate 501 and the PCB 508. Moreover, the first and second pillars 517, 518 provide structural support in the creation of space between the device substrate 501 and the PCB 508. As appreciated by one of ordinary skill in the art, the first and second regions 513, 514 provide the "topside" cavities to the first, second and third BAW resonators 502, 504, 506 required for their proper mechanical oscillation. Generally, as described below, a pillar wall is disposed circumferentially around the first, second and third BAW resonators 502, 504, 506 and their attendant circuitry. As can be appreciated, first and second pillars 517, 518 are two sides or walls of the circumferentially disposed pillar wall. The third, fourth and fifth pillars 519~521 provide electrical connections between the first, second and third BAW resonators 502, 504, 506 and first, second and third electrical connections 522~524 provided in the PCB 508. As depicted for purposes of illustration, the first, second and third electrical connections 522~524 are in electrical contact with first, and second bond pads 525, 526 which are used for electrically connecting the first, second and third BAW resonators 502, 504, 506 to circuitry (not shown) upon mounting of the encapsulated electronic structure 500 to another substrate (not shown).

An encapsulating layer 527 is provided over a side 528 of the device substrate 501 opposing the side of the device substrate 501 over which the first, second and third BAW resonators 502, 504, 506 are disposed. The encapsulating layer also extends along first and second sides 530, 531 of the device substrate 501, along side 532 of first pillar 517, and along side 533 of second pillar 518. Finally, the encapsulating layer 527 is provided over a top surface 534 of layer 512 of PCB 508.

The encapsulating layer 527 may be one of a number of known electronic molding compounds, and, as its name suggests, encapsulates the device substrate 501 with the PCB 508. Notably, in the depicted embodiment the first and second pillars 517, 518 extend between the device substrate 501 and the PCB 508, and prevent the ingress of the encapsulating layer 527 into any of the first through fourth regions 513~516 and thus prevent the molding compound from which it is formed from contacting the first, second and third BAW resonators 502, 504, 506 or any of their attendant circuitry. As appreciated by one of ordinary skill in the art, the contacting of the molding compound can be detrimental to the performance of the BAW resonator circuit of which first, second and third BAW resonators 502, 504, 506 are a part.

In certain embodiments, the encapsulating layer 527 may provide a hermetic seal of the first, second and third BAW resonators 502, 504, 506 or any of their attendant circuitry. However, this is not essential to ensure hermeticity. For example, the first and second pillars 517, 518 may form a hermetic seal through bonding to first and second solder pads 535, 536 disposed over surface 534 of the PCB 508. In other representative embodiments, a sealing layer 537 is provided over the first, second and third BAW resonators 502, 504, 506 and attendant circuitry.

The encapsulated electronic structure 500 is configured to have a first recess 538 and a second recess 539 formed in the PCB 508 through the removal of certain layers thereof. For example, in the representative embodiment depicted in FIG. 5, the first and second recesses 538, 539 are formed by the selective removal of portions of layers 511, 512 of the PCB 508. Illustratively, the first and second recesses 538, 539 are formed using a known drilling or milling technique, but other ways of forming the recesses within the purview of one of ordinary skill in the art are contemplated. Moreover, the first and second recesses 538, 539 are located to be aligned with the BAW active area. Beneficially, and among other attributes, the first and second recesses 538, 539 accommodate devices, or components, or both (not shown) disposed on either the device substrate 501 or the PCB 508, or both, while maintaining a substantially "flush" package structure.

Figure 6A:
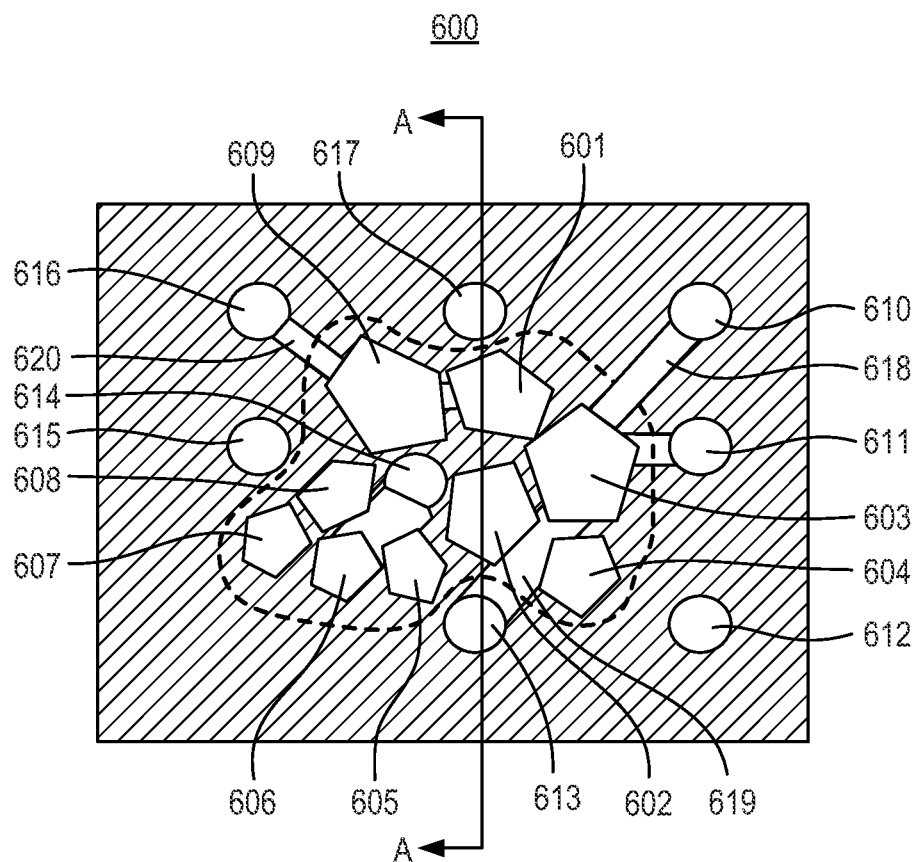
FIG. 6A is a top view of a device substrate in accordance with a representative embodiment.

FIG. 6A is a top view of a device substrate 600 in accordance with a representative embodiment. Many aspects of the device substrate 600 are common to those of the device substrate 200 and are not necessarily repeated in order to avoid obscuring the description of the currently described representative embodiment.

Notably, in the representative embodiments described in connection with FIGS. 6A-7C, a pillar wall is not provided around the BAW resonators of the device substrate 600 and their attendant circuitry (depicted by the dotted line in FIGS. 6A-6B and often referred to as the "BAW resonator active area"). Rather, and as described in connection with embodiments of FIGS. 7A and 7B, a polymer is dispensed and cured to create a topside cavity for the device substrate 600. Similar to representative embodiments described above, the electrical interconnect pillars, and any mechanical pillars are provided on the device substrate 600. After standard singulation, the device substrate 600 is placed face down on a PCB and attached using standard die attach techniques (e.g., a sequence of flux coating, die placement, and reflow). However, in the embodiments described presently, a viscous polymer is dispensed around the perimeter of the device substrate 600 and cured.

First through ninth BAW resonators 601~609 are provided over the device substrate 600. First through ninth BAW resonators 601~609 and their attendant circuitry are depicted by the dotted line in FIGS. 6A-6B and are often referred to as the "BAW resonator active area." First through eighth pillars 610~617 are provided over the device substrate 600 and provide electrical connections from the first through ninth BAW resonators 601~609 to circuitry external to the device substrate (e.g., to circuitry on an opposing PCB such as PCB 108). Additionally, electrical traces can be provided over the device substrate 600 to enable selective electrical connections between components of the device substrate 600 to provide a desired electrical circuit (e.g., a ladder filter). For example, a first circuit trace 618 provides an electrical connection between the third BAW resonator 603 and the first pillar 610. Similarly, second circuit trace 619 provides an electrical connection between the second BAW resonator 602, the third BAW resonator 603, the fourth BAW resonator 604 and the fourth pillar 613. Finally, in the depicted embodiment, third circuit trace 620 is provided between sixth pillar 615 and ninth BAW resonator 609.

In accordance with representative embodiments, the first pillar 210 is formed over the device substrate 600 during standard processing using a method known to those practicing the art. Generally, the first through eighth pillars 610~617 are formed near the end of the processing steps for creating the first through ninth BAW resonators 601~609 over the device substrate 600.

Figure 6B:
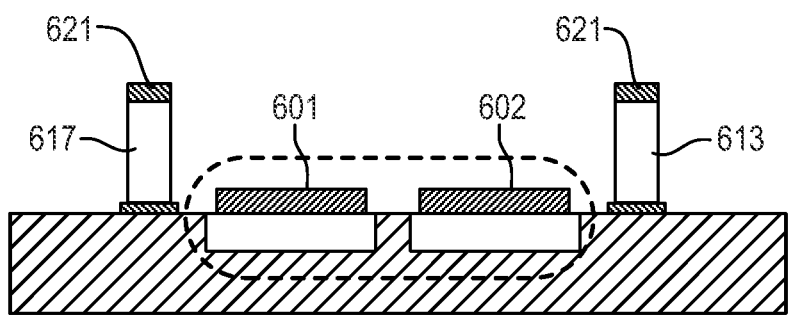
FIG. 6B is a cross-sectional view of a device substrate taken along the line A-A' in FIG. 6A.

FIG. 6B is a cross-sectional view of device substrate 600 taken along the line A-A' in FIG. 6A. Notably, after formation of the first through eighth pillars 610~617, a solder 621 is provided (e.g., plated) over each of the first through eighth pillars 610~217. This solder can be Sn, SnAg, a SnAgCu alloy, or other suitable eutectic material, and illustratively has a thickness of approximately 10 μm to approximately 40 μm. After completion of BAW resonator die processing, the substrate (wafer) is singulated into individual die (i.e., device substrate 600) using a method known to one of ordinary skill in the art. The device substrate 600 can then be attached to the PCB (not shown in FIG. 6B).

Figure 7A:
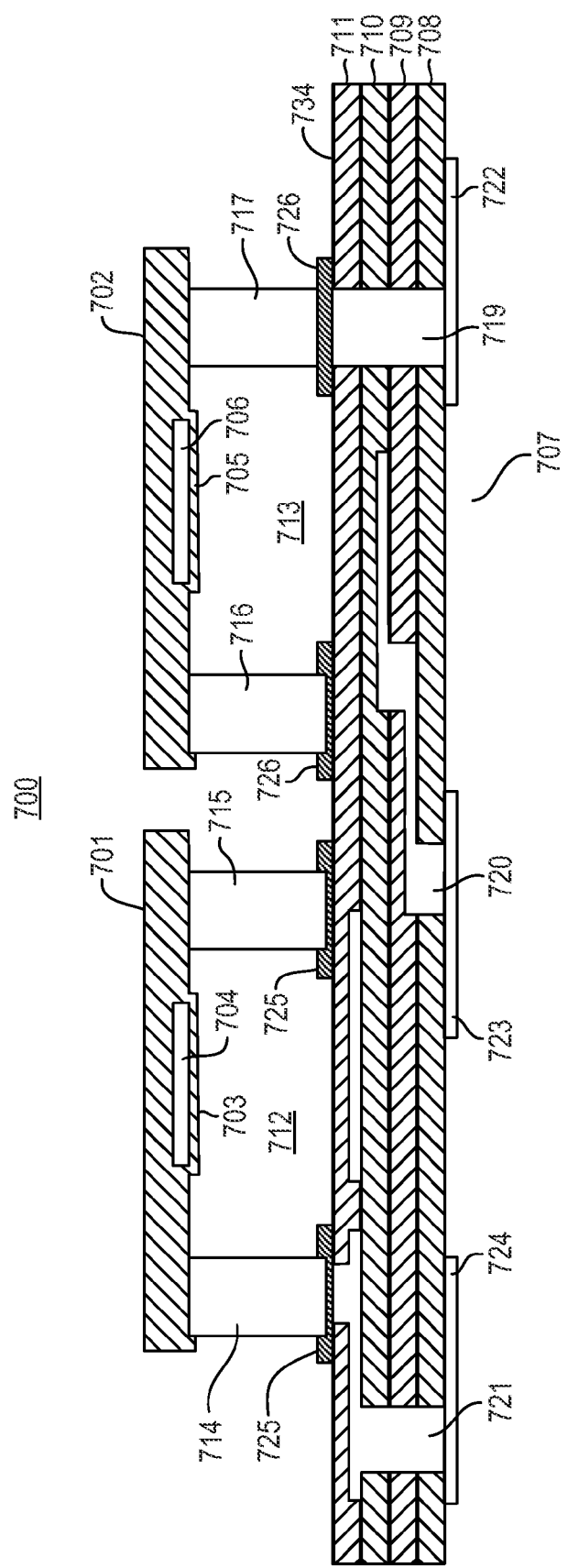
FIG. 7A is a cross-sectional view of an electronic structure in accordance with a representative embodiment, and prior to sealing and encapsulating.

FIG. 7A is a cross-sectional view of an electronic structure 700 in accordance with a representative embodiment, and prior to sealing and encapsulating. Many aspects of the electronic structure 700 are common to those of the encapsulated electronic structure 100, the device substrate 200, the electronic structure 300, the encapsulated electronic structure 400, the encapsulated electronic structure 500, and the device substrate 600 described above, and are not necessarily repeated in order to avoid obscuring the description of the currently described representative embodiment.

The electronic structure 700 comprises a first device substrate 701 and a second device substrate 702. The first device substrate 701 comprises a first BAW resonator 703 disposed over a first cavity 704 formed in the first device substrate 701. The second device substrate 702 comprises a second BAW resonator 705 disposed over a second cavity 706 formed in the second device substrate 702. As appreciated by one of ordinary skill in the art, the first and second BAW resonators 703, 705 are FBARs. It is emphasized that first and second BAW resonators 703, 705 may be SMRs with the first and second cavities 704,706 being replaced by an acoustic reflector (not shown) such as a Bragg reflector comprising alternating layers (not shown) of high and low acoustic impedance materials.

A printed circuit board (PCB) 707 is disposed opposing the first device substrate 701. The PCB 707 may be, for example, a product module substrate, that is packaged in accordance with representative embodiments described herein. In a representative embodiment, the PCB 707 comprises a plurality of layers 708, 709, 710 and 711. The PCB 707 and constituent layers 708, 709, 710 and 711 may be of a known material selected for the application of the circuits supporting the application of the first and second BAW resonators 703, 705.

Between the first device substrate 701 and the PCB 707, a first region 712 and a second region 713 are formed by the separation provided by a first pillar 714, a second pillar 715, a third pillar 716, a fourth pillar 717 and a polymer (not shown in FIG. 7A) described below. As appreciated by one of ordinary skill in the art, the first and second regions 712, 713 provide the "topside" cavities to the first and second BAW resonators 703, 705 required for their proper mechanical oscillation. Generally, as described below, a sealing wall is formed by first pillar 714, second pillar 715, a third pillar 716, a fourth pillar 717 and the polymer circumferentially around the first and second BAW resonators 703, 706 and their attendant circuitry ('the active region' such as outlined by the dotted line in FIGS. 2A~2B, 6A-6B). As can be appreciated, first through fourth pillars 714~717 provide electrical connections between the first and second BAW resonators 703~705 and first, second and third electrical connections 719~721 provided in the PCB 707. First through fourth pillars 714~717 also provide mechanical support in maintaining the separation between the first and second device substrates 701, 702 and the PCB 707. As depicted for purposes of illustration, the first, second and third electrical connections 719~721 are in electrical contact with first through second bond pads 721~723 which are used for electrically connecting the first and second BAW resonators 703, 705 and circuitry on the device substrate 200 to circuitry (not shown) upon mounting of the electronic structure 700 to another substrate (not shown).

Figure 7B:
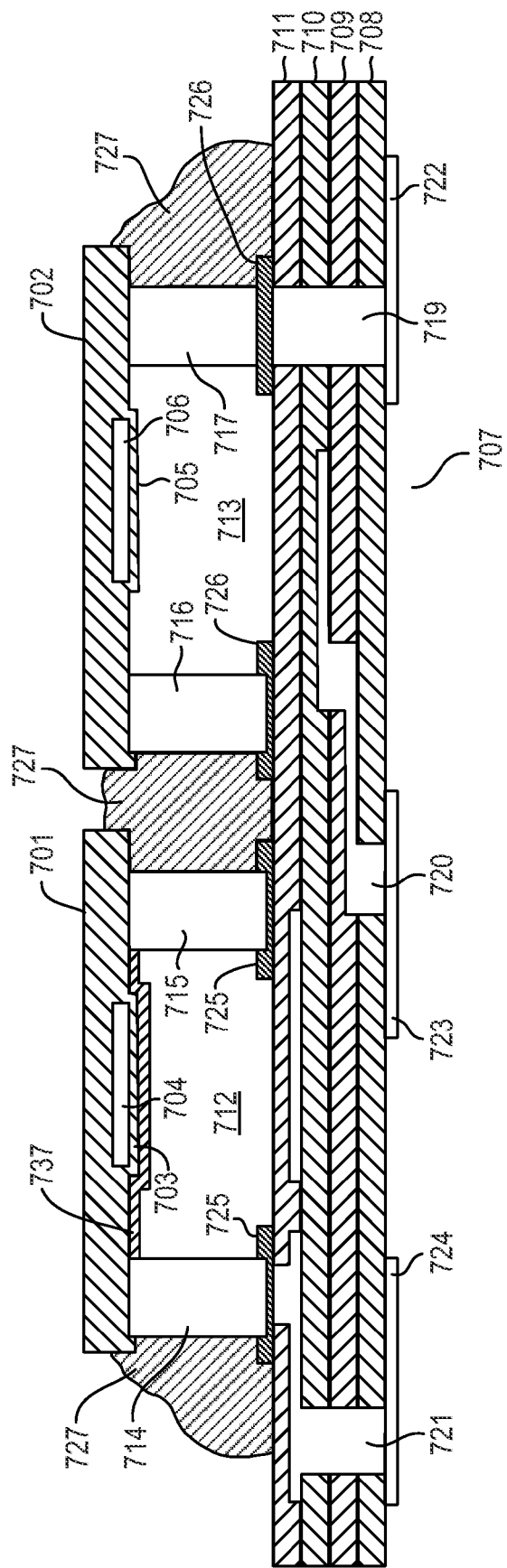
FIG. 7B is a cross-sectional view of an electronic structure in accordance with a representative embodiment.

FIG. 7B is a cross-sectional view of an electronic structure 700 after deposition of a polymer 727 in accordance with a representative embodiment. Notably, the polymer 727 is dispensed over the PCB 707 in a pattern around the respective perimeters of each of the first and second device substrates 701, 702, and then cured. In a representative embodiment, the polymer 727 comprises a suitable epoxy material, silicone or polyimide provided a at a height and width sufficient to create a seal around the first and second regions 712, 713 as depicted. As will be appreciated by one of ordinary skill in the art, the width of the polymer 727 measured from first through fourth pillars 714~717 depends on the viscosity of the material selected for the polymer 727. Illustratively, the polymer has a width of approximately 1 mm, and a height that extends above each of first through fourth pillars 714~717 as depicted in FIG. 7B. After deposition of the polymer 727, it is cured by a known technique for the particular material selected for the polymer 727. Beneficially, after curing, the polymer 727 serves as a seal ring to substantially prevent overmold compound from the subsequent high pressure overmolding step to ingress into the BAW resonator active area.

The encapsulating layer 729 may be one of a number of known electronic molding compounds, and, as its name suggests, encapsulates the first and second device substrates 701, 702 with the PCB 707. Notably, after deposition of the polymer 727 and encapsulation by the encapsulation layer 729, the first and second regions 712, 713 form respective cavities between opposing inner surfaces of first and second device substrates 701, 702 and the PCB 108. In the depicted embodiment the first through fourth pillars 714~717 extend between the first and second device substrates 701, 702 and the PCB 707, and prevent the ingress of the molding compound (not shown in FIG. 7B) into any of the first and second regions 712, 713 and thus prevent the molding compound from which they are formed from contacting the first and second BAW resonators 703,705 or any of their attendant circuitry. As appreciated by one of ordinary skill in the art, the contacting of the molding compound can be detrimental to the performance of the BAW resonator circuit of which first and second BAW resonators 703,705 are a part.

In certain embodiments, the encapsulating layer 729 may provide a hermetic seal of the first and second BAW resonators 703,705 or any of their attendant circuitry. However, this is not essential to ensure hermeticity. For example, the first through fourth pillars 714~717 may form a hermetic seal through bonding to first and second solder pads 725, 726 disposed over surface 734 of the PCB 707. In other representative embodiments, a sealing layer 737 is provided over the first and second BAW resonators 703,705 and attendant circuitry.

Figure 7C:
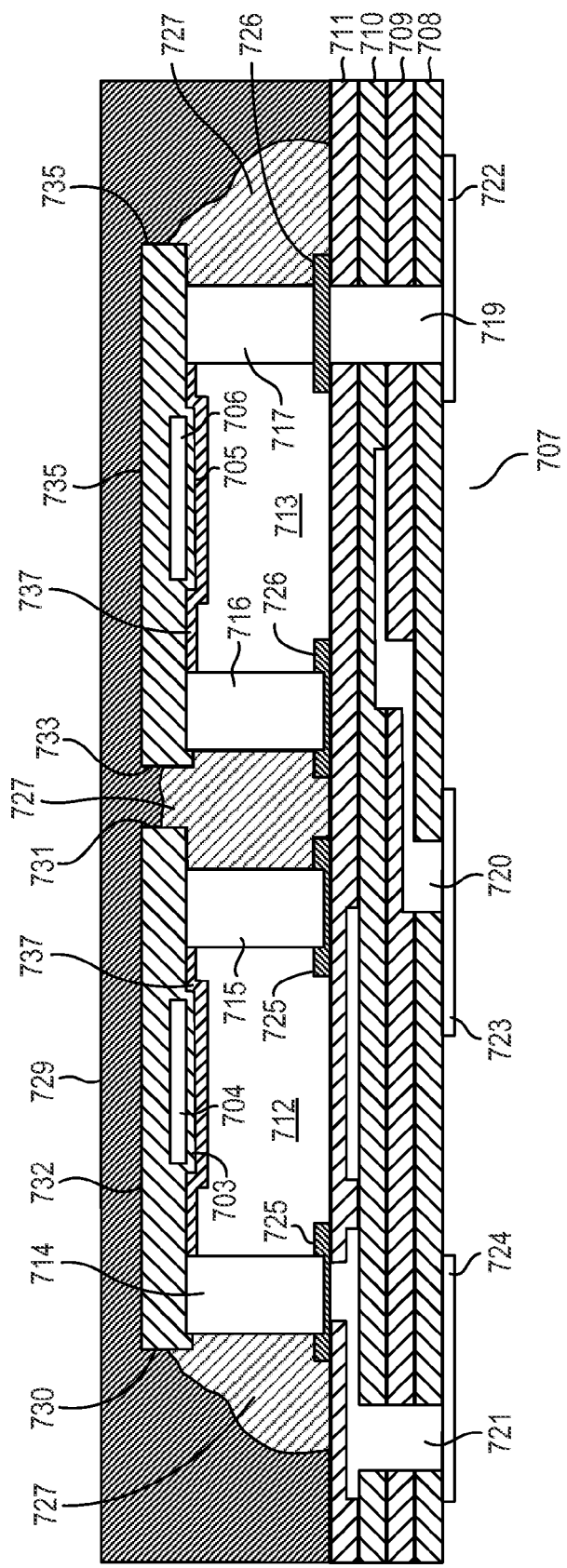
FIG. 7C is a cross-sectional view of an electronic structure after deposition of an encapsulating layer in accordance with a representative embodiment.

FIG. 7C is a cross-sectional view of an electronic structure 700 after deposition of an encapsulating layer 729. The encapsulating layer 729 is provided over first and second sides 730, 731 and over a top surface 732 of the first device substrate 701; over first and second sides, and over a top surface 735 of the second device substrate 702; and over exposed portions of the polymer 727 to substantially completely encapsulate the first and second device substrates 701, 702.

Notably, piezoelectric layers consisting of both undoped and doped portions of piezoelectric material have been discussed herein with reference to BAW resonator devices, including FBARs and SMRs, as examples. However, it is understood that such piezoelectric layers may be formed in resonator stacks of various other types of resonator devices, without departing from the scope of the present teachings. For example, piezoelectric layers consisting of undoped and doped portions of piezoelectric material may be formed in resonator stacks of a stacked bulk acoustic resonator (SBAR) device, a double bulk acoustic resonator (DBAR) device, or a coupled resonator filter (CRF) device.

In accordance with illustrative embodiments, bulk acoustic wave (BAW) resonators for various applications such as in electrical filters are described having an electrode comprising a cantilevered portion. Additionally, bulk acoustic wave (BAW) resonators for various applications such as in electrical filters are described having an electrode comprising a cantilevered portion and a bridge. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

We claim:

1. An electronic package, comprising:
   a first substrate comprising a die;
   a second substrate disposed beneath the first substrate;
   a pillar wall comprising a plurality of pillars, each of the pillars extending between a surface of the die and an opposing surface of the second substrate to provide separation between the die and the second substrate, the pillar wall extending around a perimeter bounding the die and enclosing a cavity between the first and second substrates;
   an encapsulating layer disposed over the first and second substrates and around the pillar wall, wherein substantially none of the encapsulating layer ingresses into the cavity; and
   a sealing layer disposed over a surface of the first substrate and die and between the first substrate and the cavity, the sealing layer not being disposed between the surface of the first substrate and each one of the plurality of pillars.

2. The electronic package of claim 1, wherein the second substrate comprises a printed circuit board.

3. The electronic package of claim 1, wherein the pillar wall comprises a metal or a metal alloy.

4. The electronic package of claim 1, further comprising a pillar in electrical contact with a device on the die and with a contact on the second substrate.

5. The electronic package as claimed in claim 2, wherein the die comprises a bulk acoustic wave (BAW) resonator.

6. The electronic package as claimed in claim 5, wherein the BAW resonator comprises a film bulk acoustic wave resonator (FBAR).

7. The electronic package as claimed in claim 5, wherein the BAW resonator comprises a solidly mounted acoustic wave resonator (SMR).

8. The electronic package of claim 1, further comprising a mold compound disposed over the second substrate and adjacent to an outer portion of the pillar wall and over a portion of the first substrate.

9. The electronic package of claim 8, wherein the mold compound is either an epoxy or a polyimide.

10. A micro-electromechanical system (MEMS) package, comprising: a first substrate comprising a die; a second substrate disposed beneath the first substrate; a pillar wall comprising a plurality of pillars, each of the pillars extending from a surface of the first substrate near but not contacting an opposing surface of the second substrate leaving a separation between an end of the pillar wall and the second substrate, the pillar wall extending about a perimeter bounding the die and enclosing a cavity between the first and second substrates; a mold compound disposed over the second substrate and adjacent to an outer portion of the pillar wall, over a portion of the first substrate, and substantially filling the separation between an end of the pillar wall and the first substrate; and a sealing layer disposed over a surface of the first substrate and die, and between the first substrate and the cavity, the sealing layer not being disposed between the surface of the first substrate and each of the plurality of pillars.

11. The MEMS package of claim 10, wherein the second substrate comprises a printed circuit board.

12. The MEMS package of claim 10, wherein the pillar wall comprises a metal or a metal alloy.

13. The MEMS package of claim 10, further comprising a pillar in electrical contact with a device on the die and with a contact on the second substrate.

14. The MEMS package as claimed in claim 10, wherein the die comprises a bulk acoustic wave (BAW) resonator.

15. An electronic package, comprising:
    a first substrate comprising a die;
    a second substrate disposed beneath the first substrate; and
    a plurality of pillars extending between a surface of the first substrate and an opposing surface of the second substrate to provide separation between the die and the second substrate;
    a polymer layer disposed adjacent to each of the plurality of pillars such that a cavity is created between the first and second substrates by the polymer layer and the plurality of pillars;
    an encapsulating layer disposed over the first and second substrates and around the plurality of pillars and polymer layer, wherein substantially none of the encapsulating layer ingresses into the cavity; and
    a sealing layer disposed over a surface of the first substrate and die and between the first substrate and the cavity, the sealing layer not being disposed between the surface of the first substrate and each of the plurality of pillars.

16. The electronic package of claim 15, wherein the second substrate comprises a printed circuit board.

17. The electronic package of claim 15, wherein each of the plurality of pillars comprises a metal or a metal alloy.

18. The electronic package of claim 15, wherein the die comprises a bulk acoustic wave (BAW) resonator.

19. The electronic package of claim 15, wherein the polymer layer is not disposed over an upper surface of the first substrate.

* * * * *